(12) United States Patent
Han

(10) Patent No.: US 8,796,920 B2
(45) Date of Patent: Aug. 5, 2014

(54) ORGANIC LIGHT EMITTING DISPLAY AND FABRICATING METHOD OF THE SAME

(75) Inventor: Dong Won Han, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1190 days.

(21) Appl. No.: 11/633,398

(22) Filed: Dec. 4, 2006

(65) Prior Publication Data

US 2007/0235729 A1    Oct. 11, 2007

(30) Foreign Application Priority Data

Apr. 7, 2006    (KR) .................. 10-2006-0032075

(51) Int. Cl.
*H01L 27/32*  (2006.01)
*H01L 51/52*  (2006.01)

(52) U.S. Cl.
USPC .................. 313/512; 257/40; 257/E51.02

(58) Field of Classification Search
USPC ............... 257/40, 79–103, E51.019, E51.02, 257/E51.021, E51.022; 438/99; 313/498–512
See application file for complete search history.

(56) References Cited

U.S. PATENT DOCUMENTS

| | | | | |
|---|---|---|---|---|
| 5,239,228 A | * | 8/1993 | Taniguchi et al. | ............ 313/512 |
| 6,555,025 B1 | | 4/2003 | Krupetsky et al. | |
| 6,998,776 B2 | * | 2/2006 | Aitken et al. | ................. 313/512 |
| 7,084,426 B2 | * | 8/2006 | Uchida | ............................ 257/40 |
| 7,759,864 B2 | * | 7/2010 | Lee et al. | ...................... 313/512 |
| 2002/0155320 A1 | * | 10/2002 | Park et al. | ..................... 428/690 |
| 2002/0158568 A1 | * | 10/2002 | Satake | ......................... 313/493 |
| 2004/0178727 A1 | * | 9/2004 | Song et al. | ..................... 313/512 |
| 2004/0252113 A1 | * | 12/2004 | Vicentini et al. | .............. 345/205 |
| 2005/0151151 A1 | * | 7/2005 | Hawtof et al. | ................. 257/100 |
| 2005/0189878 A1 | * | 9/2005 | Shitagami et al. | ............ 313/512 |
| 2005/0195355 A1 | * | 9/2005 | Kwak et al. | ..................... 349/149 |
| 2005/0233885 A1 | | 10/2005 | Yoshida et al. | |
| 2005/0247936 A1 | * | 11/2005 | Bae et al. | ......................... 257/59 |
| 2005/0264189 A1 | * | 12/2005 | Choi et al. | ..................... 313/506 |
| 2006/0138942 A1 | * | 6/2006 | Bang et al. | ..................... 313/504 |

FOREIGN PATENT DOCUMENTS

| | | |
|---|---|---|
| KR | 10-2005-0024592 A | 3/2005 |
| KR | 10-2005-0077923 A | 8/2005 |

* cited by examiner

*Primary Examiner* — Mark Tornow
*Assistant Examiner* — Eric Ward
(74) *Attorney, Agent, or Firm* — Knobbe Martens Olson & Bear LLP

(57) ABSTRACT

Disclosed is an organic light emitting display which avoids an occurrence of Newton's rings in coalesced substrate and sealing substrate. A first substrate includes a pixel region and a non-pixel region. An array of organic light emitting pixels including a first electrode, an organic layer, and a second electrode is formed at the pixel region. A second substrate opposes the first substrate. A frit is disposed between the non-pixel region of the first substrate and the second substrate for interconnecting the first substrate and the second substrate. The second electrode of the array directly contacts a region corresponding to a pixel region of the second substrate.

16 Claims, 7 Drawing Sheets

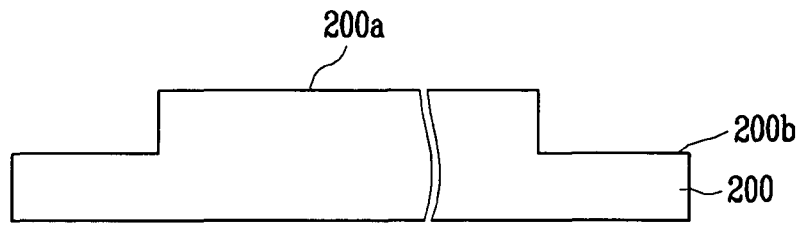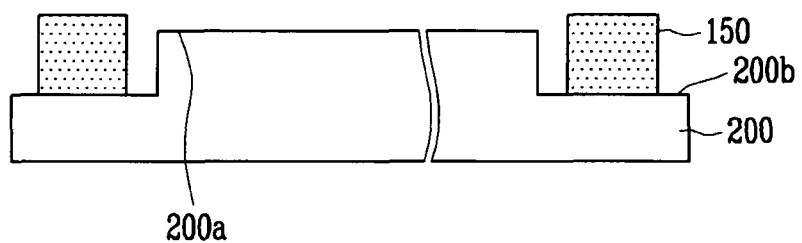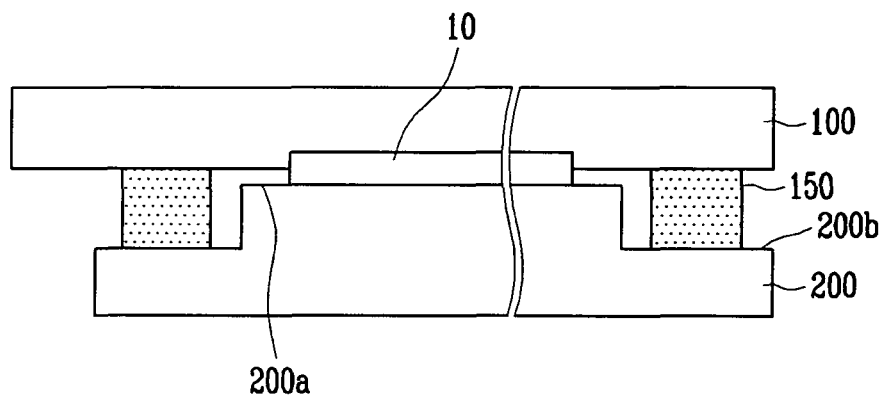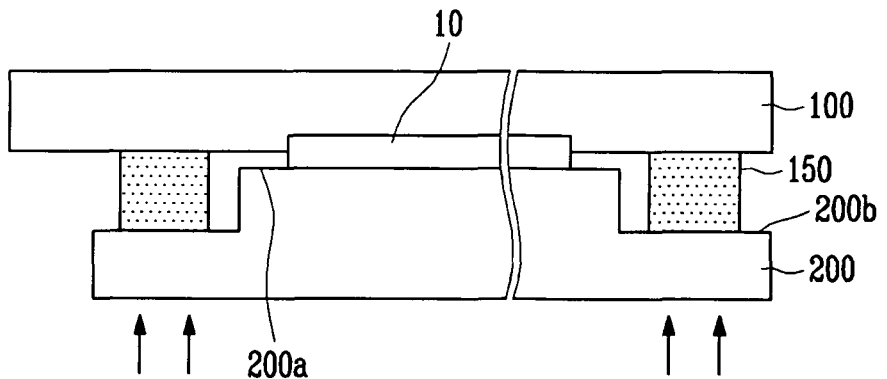
Irradiation of infrared rays layer

ORGANIC LIGHT EMITTING DISPLAY AND FABRICATING METHOD OF THE SAME

CROSS-REFERENCE TO RELATED APPLICATIONS

This application claims the benefit of Korean Patent Application No. 10-2006-0032075, filed Apr. 7, 2006, in the Korean Intellectual Property Office, the disclosure of which is incorporated herein by reference in its entirety.

BACKGROUND

1. Field of the Invention

The present invention relates to an organic light emitting display, and more particularly, to encapsulating an organic light emitting display.

2. Discussion of Related Technology

In recent years, organic light emitting displays using organic light emitting diode have come into the spotlight as the next generation display. An organic light emitting display is an emissive display, which electrically excites a phosphorous organic compound having fluorescent characteristics to emit light. Such an organic light emitting display has a high response speed, operates in low power consumption, and can be light-weighted and slimmed.

The organic light emitting display includes a plurality of pixels, each having an organic light emitting diode formed on a substrate and a thin film transistor (TFT) for driving the organic light emitting diode. Such an organic light emitting diode is susceptible to moisture. Accordingly, a sealing structure is proposed, which prevents the infiltration of moisture using a metal cap or a sealing glass substrate coated with absorbent. However, in the general organic light emitting display, in order to protect the organic light emitting diode from moisture or oxygen, the absorbent may provide other problems. So as to solve the problem, U.S. Pat. No. 6,998,776 discloses a structure for sealing an organic light emitting display by coating a glass substrate with a frit. In U.S. Pat. No. 6,998,776, a perfect sealing is achieved between a substrate and a sealing substrate using the frit, thereby efficiently protecting the organic light emitting diode.

The discussion in this section is to provide general background information, and does not constitute an admission of prior art.

SUMMARY

An aspect of the invention provides an organic light emitting display device, which may comprise: a first substrate; a second substrate opposing the first substrate; an array of organic light emitting pixels formed between the first substrate and the second substrate, wherein the array comprises a common electrode, wherein the common electrode contacts the second substrate; and a seal interconnecting the first substrate and the second substrate while surrounding the array.

In the foregoing device, the common electrode may comprise a first electrically conductive film and a second electrically conductive film, the second electrically conductive film being interposed between the first electrically conductive film and the second substrate. The second electrically conductive film may contact the second substrate. The first electrically conductive film may comprise a surface opposing the second electrically conductive film, wherein a portion of the surface may not contact the second electrically conductive film. The second electrically conductive film may have a surface opposing to the second substrate, wherein the second electrically conductive film may contact the second substrate throughout the surface. The common electrode may comprise a surface opposing the second substrate, wherein a portion of the surface may not contact the second substrate.

Still in the foregoing device, the second substrate may comprise an interior surface opposing the first substrate, wherein the seal may comprise a first end and a second end, wherein the second substrate may comprise an interior surface opposing the first substrate, wherein the second end may be attached to the interior surface, wherein the common electrode may contact the interior surface. The second substrate may comprise a central area and a peripheral area surrounding the central area, wherein the central area comprises a first interior surface opposing the first substrate, wherein the peripheral area comprises a second interior surface opposing the first substrate, wherein the second substrate comprises an exterior surface facing away from the first substrate, wherein a shortest distance between the exterior surface and the first interior surface may be greater than a shortest distance between the exterior surface and the second interior surface. The seal may comprise a first end and a second end, wherein the second end is attached to the second interior surface. The common electrode may contact the first interior surface.

Further in the foregoing device, the array may comprise the common electrode, a plurality of pixel electrodes and a plurality of organic light emitting layers. The array may comprise an organic light emitting layer which contacts the common electrode. The second substrate may be formed in a single layer. No intervening layer may be interposed between the second substrate and the common electrode. The device may be a passive matrix type organic light emitting display device. The device may be an active matrix type organic light emitting display device.

Another aspect of the invention provides a method of making an organic light emitting display device, which may comprise: providing a first substrate and an array of organic light emitting pixels formed on the first substrate, wherein the array comprises a pixel which comprises a first electrode, a second electrode and an organic light emitting layer interposed between the first and second electrodes; arranging a second substrate to oppose the first electrode; and interconnecting the first and second substrates with a frit, wherein the second electrode contacts the second substrate.

In the foregoing method, the second electrode may comprise a surface opposing the second substrate, wherein a portion of surface may not contact the second substrate. The second substrate may comprise a central area and a peripheral area surrounding the central area, wherein the central area comprises a first interior surface opposing the first substrate, wherein the peripheral area comprises a second interior surface opposing the first substrate, wherein the second substrate comprises an exterior surface facing away from the first substrate, wherein a shortest distance between the exterior surface and the first interior surface is greater than a shortest distance between the exterior surface and the second interior surface, wherein the frit comprises a first end and a second end, wherein the second end may be attached to the second interior surface, wherein the second electrode may contact the first interior surface. The second substrate may be formed in a single layer.

An aspect of the present invention provides an organic light emitting display and a fabricating method thereof, which prevent an occurrence of Newton's rings in coalesced substrate and sealing substrate.

An aspect of the present invention provides an organic light emitting display, comprising: a first substrate including a pixel region and a non-pixel region, at least one organic light emitting diode consisting of a first electrode, an organic layer, and a second electrode being formed at the pixel region, and the non-pixel region being formed around the pixel region; a second substrate coalesced with the first substrate in a sealing position of the first substrate; and a frit disposed between the non-pixel region of the first substrate and the second substrate for adhering the first substrate and the second substrate to each other, wherein the second electrode of the first substrate directly contacts with a region corresponding to a pixel region of the second substrate.

An aspect of the present invention provides a method of fabrication an organic light emitting display including a first substrate including a pixel region and a non-pixel region, at least one organic light emitting diode consisting of a first electrode, an organic layer, and a second electrode being formed at the pixel region, and the non-pixel region being formed around the pixel region, a second substrate coalesced with the first substrate by a frit, the method comprising the steps of: coating the frit along a peripheral portion of a region corresponding to a pixel region of the second substrate; sintering the frit at a predetermined temperature; coalescing the first and second substrates with each other so that a region corresponding to a pixel region of the second substrate contacts with the second electrode; and irradiating a laser to the frit to adhere the second substrate to the first substrate.

BRIEF DESCRIPTION OF THE DRAWINGS

These and other aspects and advantages of the invention will become apparent and more readily appreciated from the following description of the embodiments, taken in conjunction with the accompanying drawings of which:

FIG. 4a through FIG. 4d are cross-sectional views showing a method of fabricating an organic light emitting display according to an embodiment of the present invention;

DETAILED DESCRIPTION OF EMBODIMENTS

Figure 1:
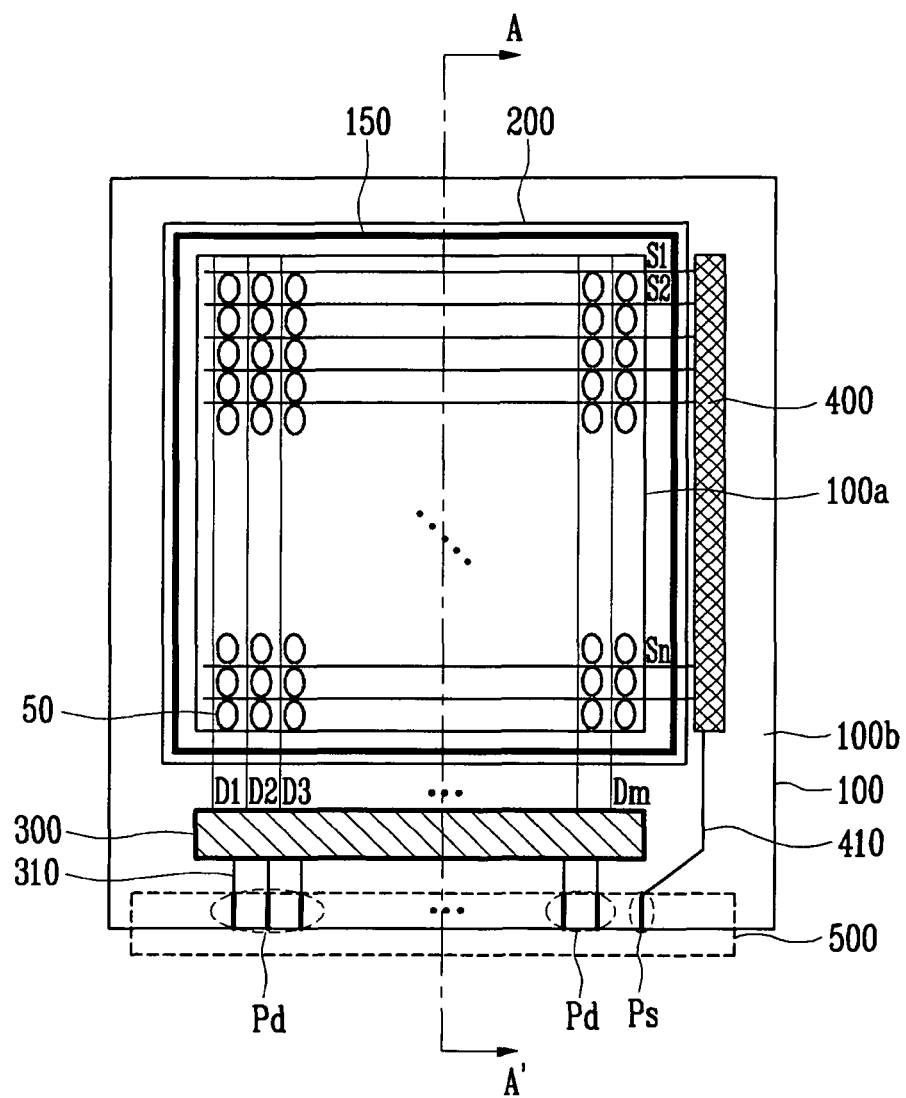
FIG. 1 is a plan view showing an example of an organic light emitting display according to an embodiment of the present invention.

Hereinafter, various embodiments according to the present invention will be described with reference to the accompanying drawings. Here, when one element is connected to another element, one element may be not only directly connected to another element but also indirectly connected to another element via another element. Further, irrelative elements are omitted for clarity. Also, like reference numerals refer to like elements throughout.

An organic light emitting display (OLED) is a display device comprising an array of organic light emitting diodes. Organic light emitting diodes are solid state devices which include an organic material and are adapted to generate and emit light when appropriate electrical potentials are applied.

Figure 5A:
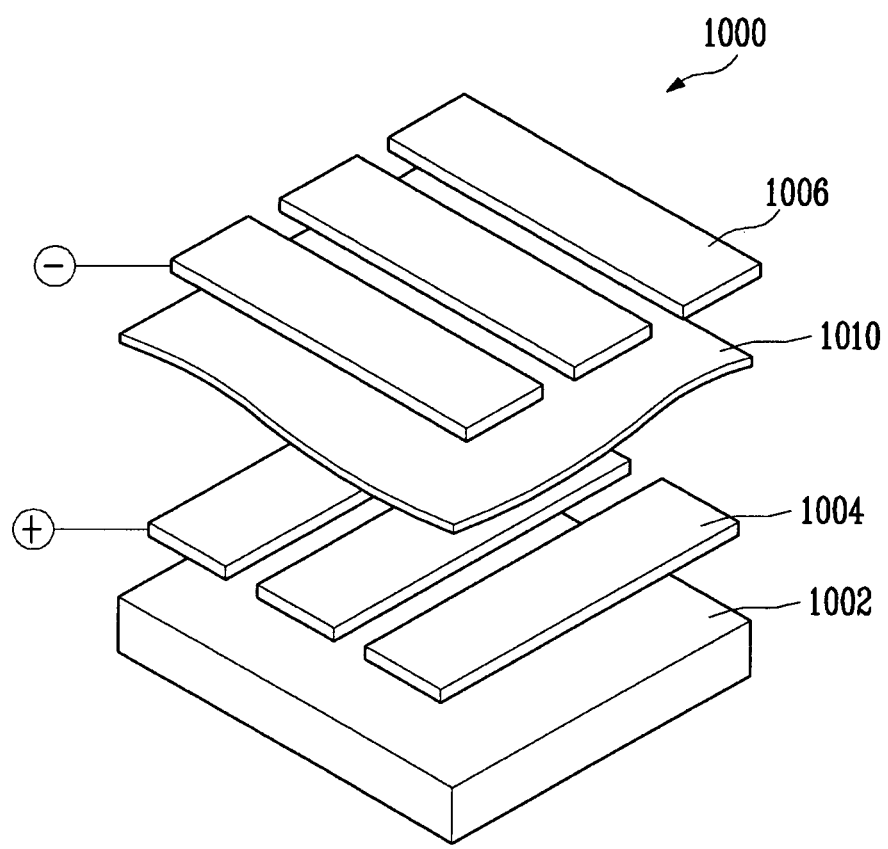
FIG. 5A is a schematic exploded view of a passive matrix type organic light emitting display device in accordance with one embodiment.
Figure 5B:
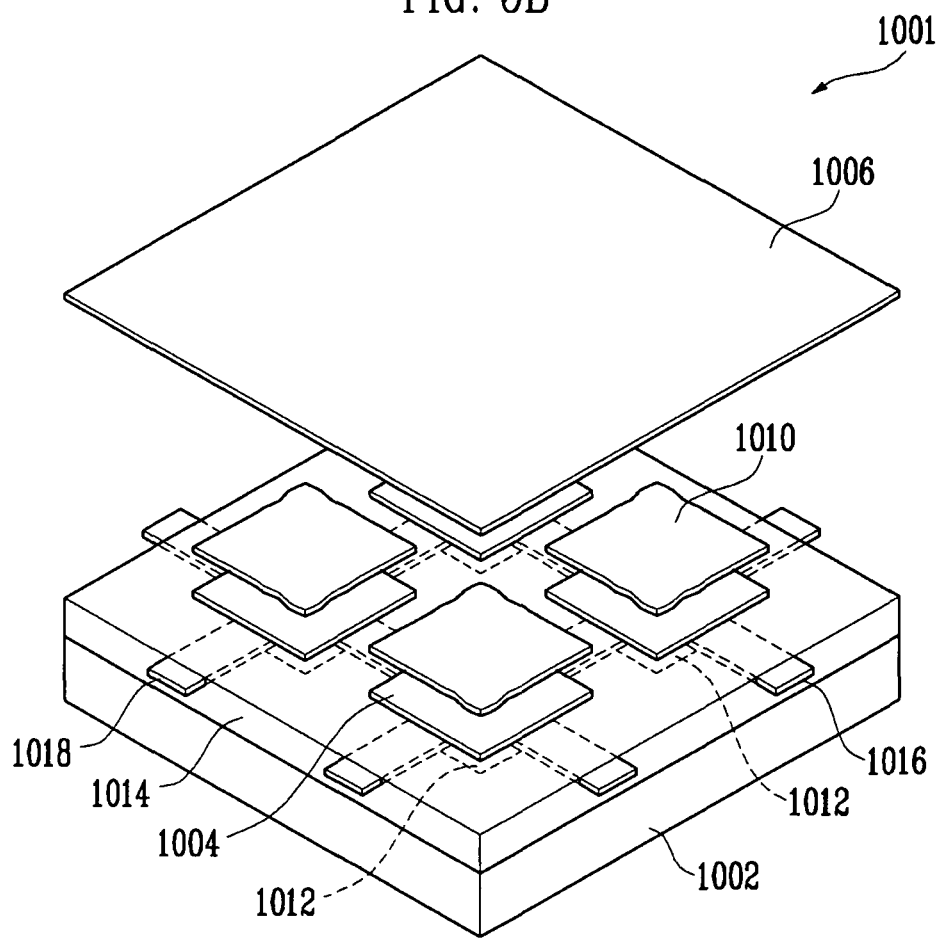
FIG. 5B is a schematic exploded view of an active matrix type organic light emitting display device in accordance with one embodiment.

OLEDs can be generally grouped into two basic types dependent on the arrangement with which the stimulating electrical current is provided. FIG. 5A schematically illustrates an exploded view of a simplified structure of a passive matrix type OLED 1000. FIG. 5B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 5A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 5B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 5C:
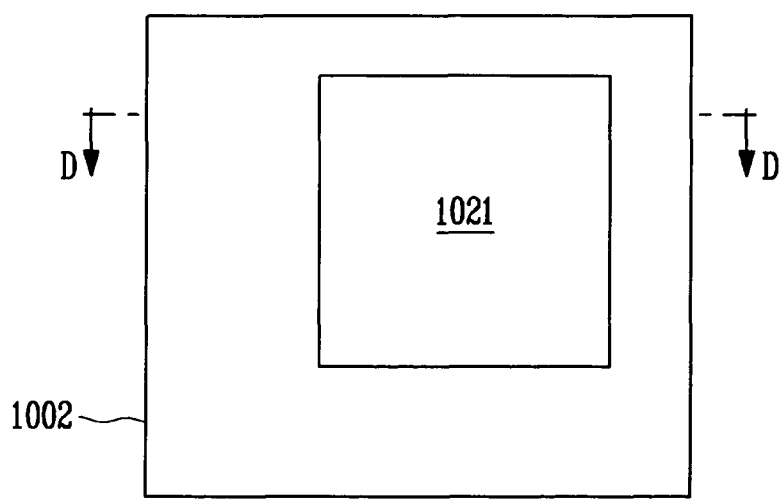
FIG. 5C is a schematic top plan view of an organic light emitting display in accordance with one embodiment.

In many embodiments, an OLED pixel array 1021 comprising a plurality of organic light emitting pixels is arranged over a substrate 1002 as shown in FIG. 5C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 5D:
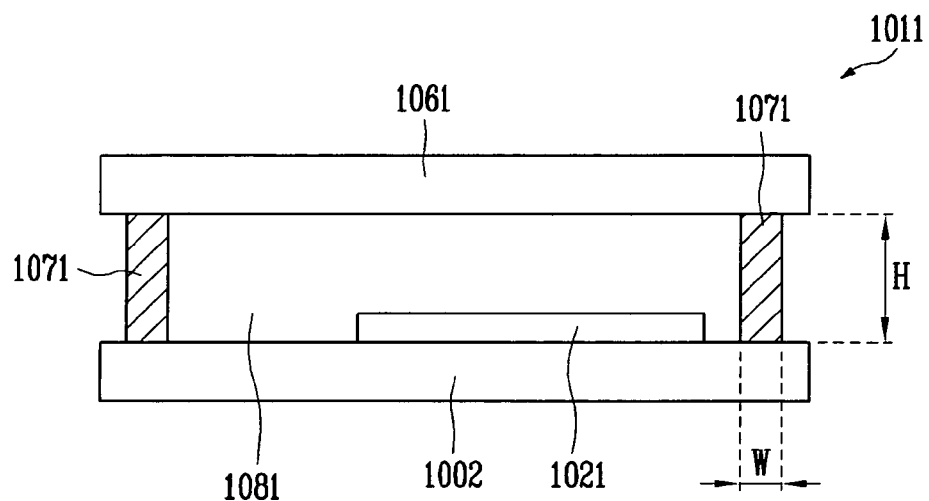
FIG. 5D is a cross-sectional view of the organic light emitting display of FIG. 5C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 5D schematically illustrates a cross-section of an encapsulated OLED device 1011 having a layout of FIG. 5C and taken along the line d-d of FIG. 5C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 5D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 5D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li$_2$O), sodium oxide (Na$_2$O), potassium oxide (K$_2$O), boron oxide (B$_2$O$_3$), vanadium oxide (V$_2$O$_5$), zinc oxide (ZnO), tellurium oxide (TeO$_2$), aluminum oxide (Al$_2$O$_3$), silicon dioxide (SiO$_2$), lead oxide (PbO), tin oxide (SnO), phosphorous oxide (P$_2$O$_5$), ruthenium oxide (Ru$_2$O), rubidium oxide (Rb$_2$O), rhodium oxide (Rh$_2$O), ferrite oxide (Fe$_2$O$_3$), copper oxide (CuO), titanium oxide (TiO$_2$), tungsten oxide (WO$_3$), bismuth oxide (Bi$_2$O$_3$), antimony oxide (Sb$_2$O$_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include ZnSiO$_4$, PbTiO$_3$, ZrO$_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxylpropyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 5E:
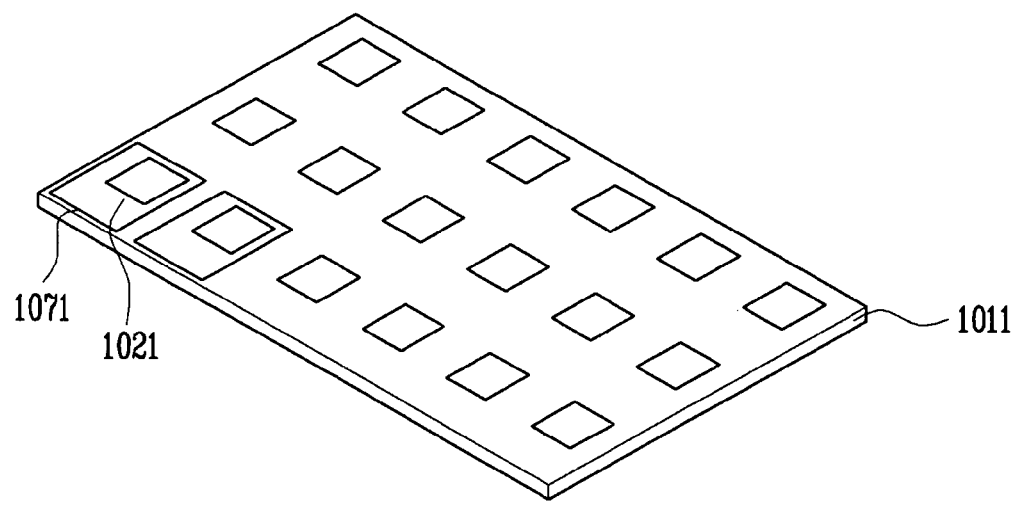
FIG. 5E is a schematic perspective view illustrating mass production of organic light emitting devices in accordance with one embodiment.

In some embodiments, OLED devices 1011 are mass produced. In an embodiment illustrated in FIG. 5E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 5D. In certain embodiments, the individual OLED devices 1011 then further undergo additional packaging operations to further improve the sealing formed by the frit seal 1071 and the top and bottom substrates 1061, 1002.

One problem may be occurred when a sealing substrate is bent toward an organic light emitting diode formed on a substrate in a structure in which the organic light emitting diode is sealed using the sealing substrate coated with a frit. For the reason, an interval between the substrate and the sealing substrate corresponding to one of intervals for both ends of the substrate and a center thereof varies. When the interval between the substrate and the sealing substrate is not uniform, Newton's rings occur due to a difference between reflective rates of light of respective parts. The Newton's rings cause display characteristics to be deteriorated.

FIG. 1 is a plan view showing an example of an organic light emitting display according to an embodiment of the present invention. With reference to FIG. 1, the organic light emitting display according to an embodiment of the present invention includes a first substrate 100, a frit 150, and a second substrate 200. The first substrate 100 includes a pixel region 100a and a non-pixel region 100b. The pixel region 100a includes a plurality of scan lines S1, S2, . . . Sn, a plurality of data lines D1, D2, . . . Dm, and a plurality of pixels at a region defined by the plurality of scan lines S1, S2, . . . Sn and the plurality of data lines D1, D2, . . . Dm. Here, each pixel is coupled with special scan line S1, S2 . . . Sn and data line D1, D2 . . . Dm, and a power supply line (not shown). Each pixel expresses any one of red, green, blue, and white colors with a predetermined luminance level. Accordingly, the pixel region 100a displays a predetermined image according to a color and a luminance of each pixel 50.

The non-pixel region 100b is formed around the pixel region 100a, and indicates all regions of the first substrate 100 except the pixel region 100a. On the other hand, the non-pixel region 100b includes a data driver 300, a scan driver 400, and a pad portion 500. The data driver 300 provides a data signal to the plurality of data lines D1, D2 . . . Dm extending in the pixel region 100a of the first substrate 100. The data driver 300 is formed at one side surface of the pixel region 100a in the first substrate 100. The scan driver 400 is formed at another side surface of the pixel region 100a adjacent to the one side surface thereof. Here, the data driver 300 is mounted on the first substrate 100 in a form of a chip using a chip on glass (COG) manner. Further, the data driver 300 is coupled with a plurality of first pads Pd in the pad portion 500 through a plurality of data supply lines 310.

The scan driver 400 sequentially provides a scan signal to the plurality of scan lines S1, S2 . . . Sn extending in the pixel region 100a. The scan driver 400 is formed at one side surface of the pixel region 100a in the first substrate 100. The scan driver 400 is coupled with at least one of first pads Ps in the pad portion 500 through at least one scan supply line 410. The pad portion 500 is formed adjacent to the data driver 300 and the scan driver 400 in the first substrate 100. The pad portion 500 is electrically coupled to the data supply line 310 and the scan supply line 410, and supplies an electric signal to the plurality of scan lines S1, S2 . . . Sn and the plurality of data lines D1, D2 . . . Dm of the pixel region 100a.

A frit 150 is disposed between the non-pixel region 100b of the first substrate 100 and the second substrate 200, and interconnects the first and second substrates 100 and 200 to each other. As shown in FIG. 1, the frit 151 is preferably coated to seal the pixel region 100, which is formed at the first substrate 100. When the scan driver 400 is a built-in type, the frit 151 may be coated to the seal the pixel region 100 and the scan driver 400.

That is, the frit 150 seals between the first substrate 100 and the second substrate 200, thereby protecting an organic light emitting diode interposed between the first substrate 100 and the second substrate 200 from moisture or oxygen. Here, the frit 150 includes a filler (not shown) for adjusting a coefficient of a thermal expansion and an absorbent (not shown) for absorbing laser or infrared rays. Moreover, irradiating the laser or infrared rays cures the frit 150. Here, an intensity of the laser irradiated to the frit 150 ranges from about 25 W to about 60 W. On the other hand, when a temperature of heat applied to glass material is suddenly reduced, a frit is produced in a form of a powder. Typically, a glass power is used to include a power oxide. Further, organic material is added to the frit to obtain a paste in a gel state. Then, the paste is sintered at a predetermined temperature to remove the organic matter in air. Further, the paste in the gel state is cured to maintain a frit in a solid state. At this time, a temperature for sintering the frit 150 ranges from about 300° C. to about 700° C.

The second substrate 200 coalesces with one region including the pixel region 100a of the first substrate 100. At this time, the second substrate 200 protects an organic light emitting diode (not shown) not to be influenced by external moisture or oxygen, which is formed at the pixel region 100a of the first substrate 100. On the other hand, the second substrate 200 coalesces with the first substrate 100 to contact with the pixel region 100a of the first substrate 100. Namely, except for an emission region (not shown), because a space is not formed between the first substrate 100 and the second substrate 200, the first and second substrates 100 and 200 coalesce with each other in parallel without an occurrence of bending. This prevents Newton's rings from occurring due to the bending of the first substrate 100 or the second substrate 200. Here, although the second substrate 200 may be formed by silicon oxide $SiO_2$, it is not limited thereto. In certain embodiments, the second substrate 200 is formed in a single layer of glass.

Figure 2:
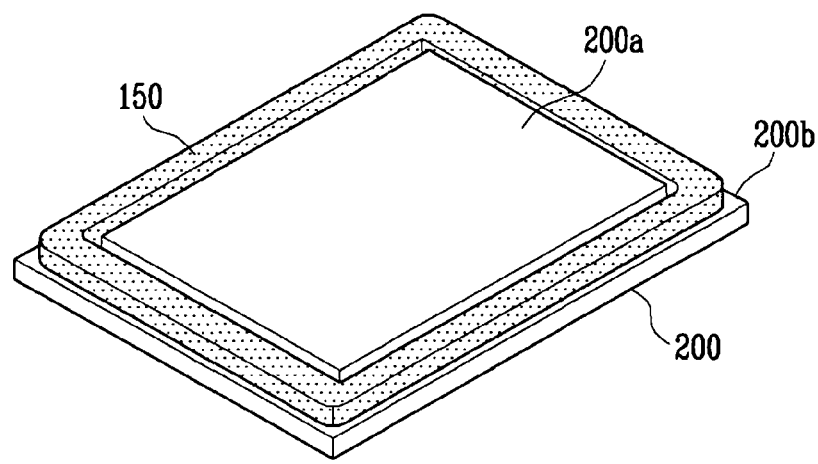
FIG. 2 is a perspective view showing an example of a sealing substrate used in the organic light emitting display shown in FIG. 1.

A description of an arrangement of preventing Newton's rings by interconnecting the first and second substrates 100 and 200 will be given with reference to FIG. 2 and FIG. 3a to FIG. 3c below. FIG. 2 is a perspective view showing an example of a sealing substrate used in the organic light emitting display shown in FIG. 1. With reference to FIG. 2, a region 200a corresponding to a pixel region of a sealing substrate 200 in an organic light emitting display according to an embodiment of the present invention is protruded more than a formation region 200b of a frit 150 in the sealing substrate 200. That is, the formation region 200b of a frit 150 is etched to protrude the region 200a corresponding to a pixel region of a sealing substrate 200. This is a structure to directly contact the region 200a corresponding to a pixel region of a sealing substrate 200 with a substrate. Accordingly, the substrate and the sealing substrate 200 contact with each other in parallel that results in no formed space between them. As a result, the substrate or the sealing substrate 200 is not bent during a predetermined process to prevent Newton's rings from occurring. On the other hand, a construction to directly contact the sealing substrate 200 with the substrate is not limited to the aforementioned arrangement. For example, a pixel definition film (not shown) may be thickly formed at the substrate to contact the sealing substrate 200 with the substrate without etching the sealing substrate 200.

Figure 3A:
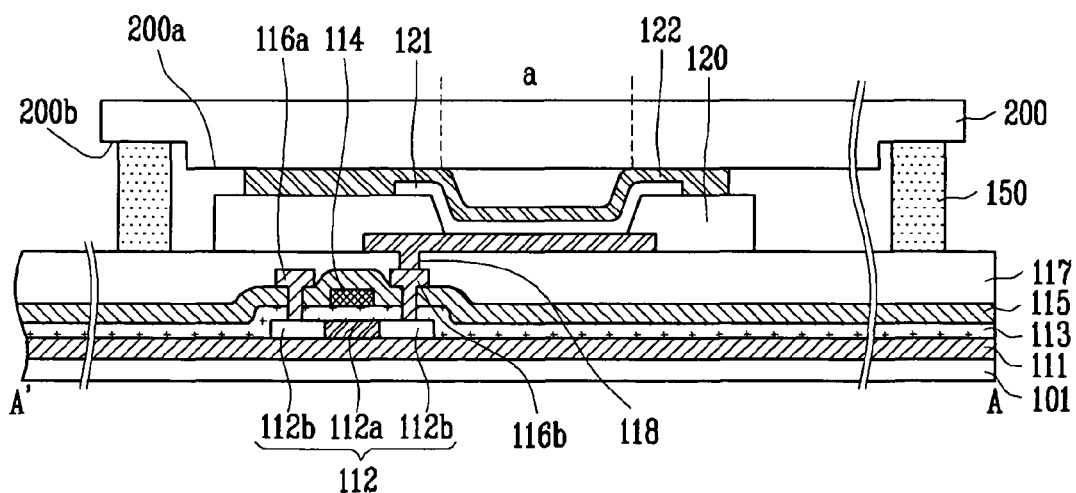
FIG. 3a is a cross-sectional view showing a first embodiment of the organic light emitting display according to an embodiment of the present invention.
Figure 3B:
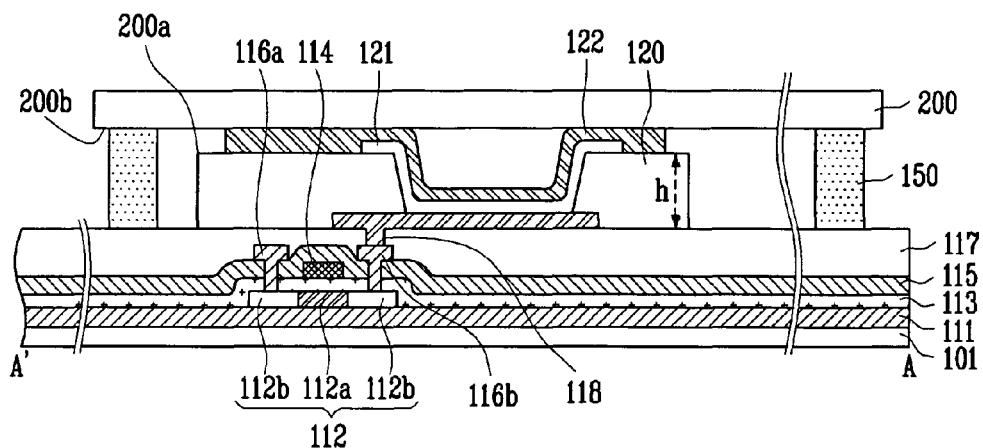
FIG. 3b is a cross-sectional view showing a second embodiment of the organic light emitting display according to an embodiment of the present invention.
Figure 3C:
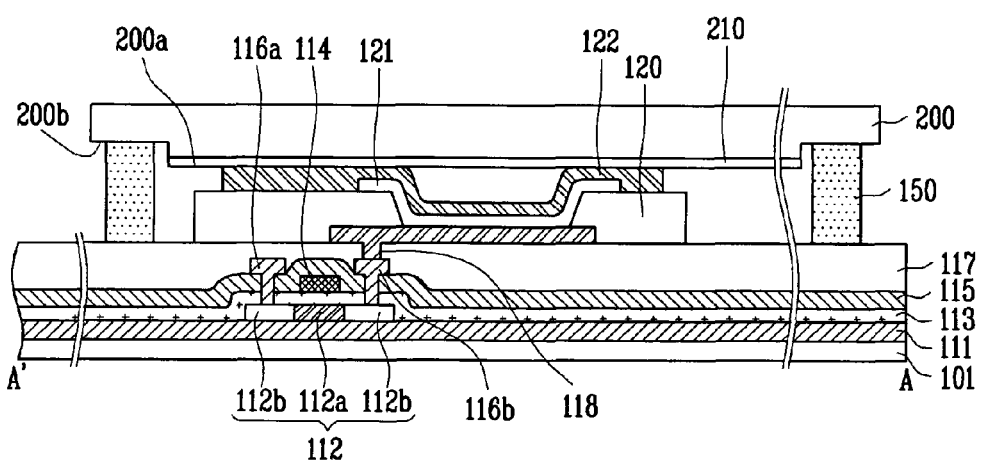
FIG. 3c is a cross-sectional view showing a third embodiment of the organic light emitting display according to an embodiment of the present invention.

FIG. 3a is a cross-sectional view showing a first embodiment of the organic light emitting display according to an embodiment of the present invention. FIG. 3b is a cross-sectional view showing a second embodiment of the organic light emitting display according to an embodiment of the present invention. FIG. 3c is a cross-sectional view showing a third embodiment of the organic light emitting display according to an embodiment of the present invention. Referring to FIG. 3a to FIG. 3c, in the organic light emitting display according to the an embodiment of present invention, a buffer layer 111 is formed on a deposition substrate 101. The deposition substrate 101 is formed by glass and the like. The buffer layer 111 is formed by insulating material such as silicon oxide $SiO_2$ or silicon nitride $SiN_X$. On the other hand, the buffer layer 111 prevents a deposition substrate 101 from being damaged due to external heat.

A semiconductor layer 112 including an active layer 112a and an ohmic contact layer 112b is formed in at least one region of the buffer layer 111. A gate insulation layer 113 is formed on the buffer layer 111 to include the semiconductor layer 112. A gate electrode 114 is formed on one region of the gate insulation layer 113, which has a size corresponding to a width of the active layer 112a. An interlayer insulation film 115 is formed on the gate insulation layer 113 to include the gate electrode 114. A source electrode 116a and a drain electrode 116b are formed on a predetermined region of the interlayer insulation layer 113. The source electrode 116a and the drain electrode 116b are coupled with an exposed region of the ohmic contact layer 112b. A planarization layer 117 is formed on the interlayer insulation film 115 to include the source and drain electrodes 116a and 116b.

A first electrode 119 is formed on one region of the planarization layer 117. Here, the first electrode 119 is coupled with an exposed region of the source and drain electrodes 116a and 116b through a via hole 118. A pixel definition film 120 is formed on the planarization layer 117 to include the first electrode 119. The pixel definition film 120 includes an opening portion (not shown) to expose at least one region of the first electrode 119. An organic layer 121 is formed at the opening portion of the pixel definition film 120. A second electrode layer 122 is formed on the pixel definition film 120 to include the organic layer 121. The second substrate 200 coalesces with the first substrate 100 by the frit, with a predetermined structure formed on the first substrate 100 between, in order to protect the structure from external oxygen or moisture. Here, the second substrate 200 may be formed by silicon oxide $SiO_2$, but is not limited thereto.

On the other hand, a construction for preventing Newton's rings from being occurring between the first substrate 100 and the second substrate 200 can be changed in various shapes. According to the embodiment of the construction shown in FIG. 3, a region 200a corresponding to a pixel region of the second substrate 200 is protruded more than a formation region 200b of the frit 150 in the second substrate 200. Namely, Etching of the formation region 200b of the frit 150 causes the region 200a corresponding to the pixel region to be protruded. This construction is to directly contact the region 200a corresponding to the pixel region of the second substrate 200 with the first substrate 100. Thus, the first substrate 100 and the second substrate 200 contact with each other in parallel that result in no formed space between them. Consequently, this can prevent Newton's rings from occurring due to the bending of the first substrate 100 or the second substrate 200 during a predetermined process.

Moreover, in a second embodiment shown in FIG. 3b to prevent a Newton's rings occurrence of a device, the pixel definition film 120 is formed at the second substrate 200 higher than a predetermined height to contact the second electrode layer 122 formed on the pixel definition film 120 with the second substrate 200, without etching the formation region 200b of the frit 150 in the second substrate 200.

In addition, in a third embodiment shown in FIG. 3c to prevent a Newton's rings occurrence of a device, after the region 200a corresponding to a pixel region of the second substrate 200 is protruded by etching the formation region 200b of the frit 150 in the second substrate 200, a transparent conductive film 210 is further formed at the protruded region 200a. On the other hand, the second electrode layer 122 is thin formed in a form of a thin film. As a result, since a resistance of the second electrode layer 122 may be high, contacting of the second electrode layer 122 with the second substrates 100 may deteriorate electric characteristics of the device.

So as to prevent it, a transparent conductive film 210 is further formed at a protruded region 200a of the second substrate 200 contacting with the second electrode layer 122, and may function as an auxiliary electrode to reduce the resistance of the second electrode layer 122. ITO (indium tin oxide) can be used as the transparent conductive film 210, although not limited thereto.

The frit 150 is disposed between a non-pixel region (not shown) of the first substrate 100 and the second substrate 200, and adheres the second substrate 200 to the first substrate 100. Here, it is preferred that the frit 150 is coated to seal a pixel region (not shown) at the first substrate 100. When a scan driver (not shown) is a built-in type, the frit 150 can be coated to seal a scan drive as well as the pixel region.

FIG. 4a through FIG. 4d are cross-sectional views showing a method of fabricating an organic light emitting display according to an embodiment of the present invention. With reference to FIG. 4a through FIG. 4d, an organic light emitting display according to an embodiment of the present invention includes a first substrate 100 and a second substrate 200. The first substrate 100 includes a pixel region (not shown) and a non-pixel region (not shown). At least one organic light emitting diode consisting of a first electrode (not shown), an organic layer (not shown), and a second electrode (not shown) is formed at the pixel region. The non-pixel region is formed around the pixel region. The second substrate 200 is adhered to the first substrate by a frit 150.

Hereinafter, a method of fabricating an organic light emitting display having a construction described above will be explained. First, a frit 150 is coated along a peripheral portion of a region 200*a* corresponding to a pixel region of the second substrate 200. At this time, the region 200*a* corresponding to a pixel region of the second substrate 200 is protruded more than a formation region 200*b* of the frit 150 in the second substrate 200. That is, etching the formation region 200*b* of the frit 150 protrudes the region 200*a* corresponding to a pixel region of the second substrate 200. This construction is to directly contact the region 200*a* corresponding to the pixel region of the second substrate 200 with the first substrate (not shown). Accordingly, the first substrate and the second substrate 200 contact with each other in parallel that results in no formed space between them. As a result, the first substrate or the second substrate 200 is not bent during a predetermined process to prevent the occurrence of Newton's rings.

Next, the frit 150 is sintered at a predetermined temperature to remove impurities and organic matters therein, with the result that the frit 150 is cured (FIG. 4*a* and FIG. 4*b*). Then, the second substrate 200 coalesces with the first substrate 100 so that at least the organic light emitting diode 10 of the first substrate 100, preferably, a second electrode of the organic light emitting diode 10 contacts with the second substrate 200 in parallel (FIG. 4*c*). Thereafter, infrared rays or laser is irradiated to the frit 150 to melt and cure it, so that the first substrate 100 and the second substrate 200 are adhered to each other (FIG. 4*d*).

On the other hand, a method of fabricating an organic light emitting display according to an embodiment of the present invention was described with reference to FIG. 4*a* to FIG. 4*d*. However, a structure of the second substrate 200 to directly contact the second substrate 200 with the first substrate 100 and a fabricating method thereof may be not limited to the aforementioned description but changed variously.

A transparent conductive film (not shown) is further formed at a predetermined region of the second substrate 200, which directly contacts with the first substrate 100. The transparent conductive film enhances electric characteristics upon contacting the second substrate 200 with the first substrate 100. Furthermore, a pixel definition film (not shown) may be thickly formed at the first substrate to contact the second substrate 200 with the first substrate 100 without etching a formation region 200*b* of the frit 150 in the second substrate 200.

Although various embodiments of the present invention have been shown and described, it would be appreciated by those skilled in the art that changes might be made in this embodiment without departing from the principles and spirit of the invention, the scope of which is defined in the claims and their equivalents.

In accordance with an organic light emitting display and a fabricating method thereof according to embodiments of the present invention, a sealing substrate contacts with a pixel region of a substrate in parallel to prevent the occurrence of Newton's rings due to bending of the substrate and the sealing substrate.

What is claimed is:
1. An organic light emitting display device, comprising:
a first substrate;
a second substrate opposing the first substrate, wherein the second substrate is formed in a single layer, and wherein the second substrate comprises a central area and a peripheral area surrounding the central area, wherein the central area comprises a first interior surface facing the first substrate, wherein the peripheral area comprises a second interior surface opposite the first substrate that extends to an edge of the second substrate, wherein the first interior surface does not contact an adhesive layer;
an array of organic light emitting pixels formed on the first substrate, wherein the array comprises a common electrode; and
a seal interconnecting the first substrate and the second substrate while surrounding the array, the seal comprising a thickness between the first and second substrates, wherein the seal contacts the second substrate in the peripheral area and provides a barrier to oxygen of less than approximately $10^{-3}$ cc/m$^2$-day and to water of less than $10^{-6}$ g/m$^2$-day;
wherein the second substrate comprises an exterior surface facing away from the first substrate, and wherein a first distance comprises a shortest distance between the exterior surface and the first interior surface and a second distance comprises a shortest distance between the exterior surface and the second interior surface, wherein the first distance is greater than the second distance, and wherein the common electrode directly contacts the first interior surface at a height from the first substrate, wherein the height is calculated by subtracting the second distance-from the first distance to provide a value and then subtracting said value from the thickness of the seal.

2. The device of claim 1, wherein the common electrode comprises a first electrically conductive film and a second electrically conductive film, the second electrically conductive film being interposed between the first electrically conductive film and the second substrate.

3. The device of claim 2, wherein the second electrically conductive film contacts the second substrate.

4. The device of claim 2, wherein the first electrically conductive film comprises a surface opposing the second electrically conductive film, wherein a portion of the surface does not contact the second electrically conductive film.

5. The device of claim 2, wherein the second electrically conductive film has a surface facing the second substrate, wherein the second electrically conductive film contacts the second substrate throughout the surface.

6. The device of claim 1, wherein the common electrode comprises a surface opposing the second substrate, wherein a portion of the surface does not contact the second substrate.

7. The device of claim 1, wherein the second substrate comprises an interior surface opposing the first substrate, wherein the seal comprises a first end and a second end, wherein the second substrate comprises an interior surface opposing the first substrate, wherein the second end is attached to the interior surface, wherein the common electrode contacts the interior surface.

8. The device of claim 1, wherein the seal comprises a first end and a second end, wherein the second end is attached to the second interior surface.

9. The device of claim 1, wherein the array comprises the common electrode, a plurality of pixel electrodes and a plurality of organic light emitting layers.

10. The device of claim 1, wherein the array comprises an organic light emitting layer which contacts the common electrode.

11. The device of claim 10, wherein no intervening layer is interposed between the second substrate and the common electrode.

12. The device of claim 1, wherein the device comprises a passive matrix type organic light emitting display device.

13. The device of claim 1, wherein the device comprises an active matrix type organic light emitting display device.

14. The device of claim 1, wherein the seal includes magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, or borosilicate, or mixtures thereof.

15. The device of claim 14, wherein the seal includes chromium (Cr), iron (Fe), manganese (Mn), cobalt (Co), copper (Cu), vanadium, $ZnSiO_4$, $PbTiO_3$, $ZrO_2$, or eucryptite.

16. The device of claim 14, wherein the seal is magnesium oxide (MgO), calcium oxide (CaO), barium oxide (BaO), sodium oxide ($Na_2O$), tellurium oxide ($TeO_2$), ruthenium oxide ($Ru_2O$), rubidium oxide ($Rb_2O$), rhodium oxide ($Rh_2O$), copper oxide (CuO), tin-phosphate glass, or borosilicate.

\* \* \* \* \*

UNITED STATES PATENT AND TRADEMARK OFFICE
CERTIFICATE OF CORRECTION

PATENT NO. : 8,796,920 B2
APPLICATION NO. : 11/633398
DATED : August 5, 2014
INVENTOR(S) : Dong Won Han It is certified that error appears in the above-identified patent and that said Letters Patent is hereby corrected as shown below:

In the Specification

In column 8 at line 55, Change "hydroxylpropyl" to --hydroxyl propyl--.

Signed and Sealed this
Seventeenth Day of March, 2015

Michelle K. Lee
*Director of the United States Patent and Trademark Office*